United States Patent
Sasaura et al.

(10) Patent No.: US 7,591,895 B2
(45) Date of Patent: Sep. 22, 2009

(54) METHOD AND APPARATUS FOR PRODUCING CRYSTALS

(75) Inventors: Masahiro Sasaura, Atsugi (JP); Hiroki Kohda, Hiratsuka (JP); Kazuo Fujiura, Atsugi (JP); Takashi Kobayashi, Isehara (JP); Tadayuki Imai, Atsugi (JP); Takashi Kurihara, Mito (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 443 days.

(21) Appl. No.: 10/571,887

(22) PCT Filed: Jun. 10, 2005

(86) PCT No.: PCT/JP2005/010719

§ 371 (c)(1),
(2), (4) Date: Mar. 13, 2006

(87) PCT Pub. No.: WO2005/121416

PCT Pub. Date: Dec. 22, 2005

(65) Prior Publication Data

US 2008/0271666 A1 Nov. 6, 2008

(30) Foreign Application Priority Data

Jun. 11, 2004 (JP) .............................. 2004-174699

(51) Int. Cl.
*C30B 15/20* (2006.01)
*C30B 35/00* (2006.01)
(52) U.S. Cl. ............................. 117/18; 117/11; 117/81; 117/83; 117/206; 117/213; 117/214; 117/954
(58) Field of Classification Search .................... 117/11, 117/17, 81, 83, 200, 206, 219, 900, 18, 213, 117/214, 954
See application file for complete search history.

(56) References Cited

U.S. PATENT DOCUMENTS

| 4,404,172 A | 9/1983 | Gault |
| 4,521,272 A | 6/1985 | Gault |
| 5,290,395 A | 3/1994 | Matsumoto et al. |
| 5,342,475 A | 8/1994 | Yoshida et al. |
| 5,785,898 A | 7/1998 | Hofmeister et al. |
| 5,788,764 A | 8/1998 | Sato |
| 6,402,834 B1 | 6/2002 | Nagai et al. |
| 6,673,330 B1 | 1/2004 | Kitamura et al. |

FOREIGN PATENT DOCUMENTS

JP 61-236681 10/1986

(Continued)

*Primary Examiner*—Felisa C Hiteshew
(74) *Attorney, Agent, or Firm*—Workman Nydegger

(57) ABSTRACT

A method and an apparatus for producing crystals wherein crystal quality can be kept and a crystal composition is uniformed from a growth early stage to a growth last stage are provided. In an apparatus for producing crystals wherein the crystals 13 are grown from a liquefying raw material 12 in a crucible retained in a furnace and slowly cooling the raw material 12 in the crucible 11 from below upward, the apparatus comprises a raw material supply apparatus 18 which supplies a resupply raw material, and a reflection plate 20 placed above the crucible 11, which liquefies the resupply raw material 19 supplied from the raw material supply apparatus 18 and drops it as a liquid into the crucible.

31 Claims, 10 Drawing Sheets

FOREIGN PATENT DOCUMENTS

| | | |
|---|---|---|
| JP | 62-59593 | 3/1987 |
| JP | 62-096387 | 5/1987 |
| JP | 62-191488 | 8/1987 |
| JP | 11/1388 | 6/1999 |
| WO | WO99/63132 | 9/1999 |

METHOD AND APPARATUS FOR PRODUCING CRYSTALS

TECHNICAL FIELD

The present invention relates to a method and an apparatus for producing crystals, and more particularly relates to a method and an apparatus for producing crystals of large size with high quality by a Vertical Bridgman Method and a vertical gradient freeze method.

BACKGROUND ART

Conventionally, as a method for producing crystals, a method in which a seed crystal is contacted with the surface of a previously liquefied raw material and crystals are then grown using the seed crystal as nuclei by decreasing a temperature of the liquefied raw material has been known. As such a method, "TSSG (Top-Seeded-Solution-Growth) method" (e.g., see Patent Document 1) in which crystals are grown from a solution and "crystal pulling method" (e.g., see Patent Document 2) in which crystals are grown from a melt have been known. It is necessary for both methods to regulate the temperature of the liquefied raw material in the range of 0.1 to several tens of degrees in addition to a constant cooling rate in order to control a crystal diameter, i.e., an amount of crystal growth. There has been a first problem in that the growth rate in the crystal growth is changed depending on sites by this temperature regulation and consequently crystal quality of the crystals produces variation.

As methods for solving the first problem, a Vertical Bridgman Method (e.g., see Patent Document 3) and a vertical gradient freeze method (e.g., see Patent Document 4) have been known. In the Vertical Bridgman Method, a crucible is vertically placed to give a temperature gradient. In a temperature distribution, a lower portion of the crucible is made a lower temperature area than a crystallization temperature and an upper portion of the crucible is made a higher temperature area than the crystallization temperature by regulating output power of heating heaters. By keeping the output power of the heating heaters constant, the crystals are grown by moving the crucible to the lower temperature area to cool. Meanwhile, in the vertical gradient freeze method, the crucible is held vertically. In a temperature distribution, a lower portion of the crucible is made a lower temperature area than a crystallization temperature and an upper portion of the crucible is made a higher temperature area than the crystallization temperature by regulating output power of the heating heaters. By keeping this temperature gradient, the crystals are grown from the lower portion of the crucible by changing the output power of the heating heaters.

With reference to FIG. 1, the method for producing the crystals by the conventional Vertical Bridgman Method will be described. A raw material is filled in a crucible 1, and made into a liquefied raw material 2 by heating and liquefying. A crystal-producing furnace has the temperature distribution 5 in which the lower portion of the crucible 1 is a lower temperature area than the crystallization temperature and the upper portion of the crucible 1 is a higher temperature area than the crystallization temperature. By keeping the output power of heating heaters constant, the liquefied raw material 2 is cooled by moving the crucible 1 at a constant speed to the lower temperature area, i.e., the lower portion. Crystals 3 which have reached the crystallization temperature are grown to crystals using seed crystal 4 as nuclei.

With reference to FIG. 2, the method for producing the crystals by the conventional vertical gradient freeze method will be described. A raw material is filled in a crucible 1, and made into a liquefied raw material 2 by heating and liquefying. A crystal-producing furnace has the temperature distribution 5 in which the lower portion of the crucible 1 is a lower temperature area than the crystallization temperature and the upper portion of the crucible 1 is a higher temperature area than the crystallization temperature. By fixing the position of the crucible 1 in the furnace and keeping the temperature gradient shown in the FIGURE, the temperature of the crucible 1 is lowered at a constant rate by changing the output power of the heating heaters. Crystals 3 which have reached the crystallization temperature are grown to crystals using seed crystal 4 as nuclei by changing the temperature distribution.

In the conventional Vertical Bridgman Method and the vertical gradient freeze method, since a shape of the crystal is defined by a shape of the crucible, the temperature regulation for controlling the amount of crystal growth is not required. Therefore, the crystals can be grown by keeping a constant growth rate, and the variation of the crystal quality can be inhibited. That is, the first problem can be solved.

However, when the crystal in which a dopant is added such as In doped GaAs crystal is grown, since a segregation coefficient is not 1, the dopant at a concentration previously added is not incorporated in the crystal by keeping the concentration. Due to this phenomenon, the concentration of the dopant in the raw material is changed as the crystal is grown, and the concentration of the dopant in the crystal is also changed. When a solid solution crystal is grown, a composition of the crystal is changed when crystallized because a liquefied raw material composition and a crystal composition are different. Therefore, in both cases, there has been a second problem in that crystals having a constant composition cannot be produced.

The case of producing solid solution crystals in which the compositions are changed because the liquefied raw material composition and the crystal composition are different when grown by the Vertical Bridgman Method or the vertical gradient freeze method will be described.

A phase diagram of a solid solution crystal composed of $AB_xC_{1-x}$ is shown in FIG. 3. Three components, A, B and C may be composed of multiple elements. In the solid solution crystal, $AB_xC_{1-x}$, a liquidus line 6 and a solidus line 7 are generally dissociated. When the composition of the liquefied raw material at point a of the liquidus line 6 is used, the crystal having the composition at point b of the solidus line 7 is grown. The component B is abundantly incorporated in the solid phase, and thus, the component B in the liquid phase is reduced. Thus, in proportion to progress of the crystal growth, the composition of the liquid phase is changed from the point a to point c along the liquidus line 6, and the composition of the grown crystal is also changed to the point d along the solidus line 7.

Therefore, in the produced crystal, the composition is gradually changed from the point b to the point d over a growth direction. In accordance with FIG. 3, the composition in the growth direction of one crystal is changed from $AB_{0.8}C_{0.2}$ to $AB_{0.4}C_{0.6}$. When it is wanted to acquire the desired composition from the grown crystal, the desired composition is obtained from only a part of the crystal and productivity is remarkably low. Thus, as shown in FIG. 4, a method in which a resupply raw material 9 is additionally supplied from a raw material supply apparatus 8 during the crystal growth to inhibit the composition change has been attempted (e.g., see Patent Document 2, 5 and 6).

However, in this method, due to the additional supply of the resupply raw material 9, a third problem occurs in which a process yield is reduced due to deterioration of crystal quality and frequent occurrence of polycrystallization. In order to grow the crystals with high quality and good yield, it is necessary to grow the crystals by performing a soaking treatment in which the liquefied raw material is thoroughly decomposed at a temperature (referred to as a soaking temperature) of 20 to 100° C. higher than the crystallization temperature. When the crystals are grown without performing the soaking treatment, the crystal quality is deteriorated and the polycrystallization occurs. When the resupply raw material is supplied, it is also desirable to supply after giving the soaking treatment. However, in the conventional method, it is not possible to supply the resupply raw material after being given the soaking treatment, and the third problem described above has occurred.

Since the resupply raw material 9 is supplied in a powder or a liquid at a temperature close to the crystallization temperature, the temperature of the liquid raw material 2 is changed and the growth rate of the crystal is changed. Due to this variation in the growth rate, there has been a fourth problem in that the crystal quality produces the variation depending on grown parts.

When the crystals are grown from the melt, an overheating treatment in which the raw material is decomposed at a significantly higher temperature than the crystallization temperature is performed in place of the soaking treatment. When the resupply raw material is supplied without performing the overheating treatment, the third and fourth problems described above occur.

Patent Document 1: U.S. Pat. No. 5,785,898 Specification
Patent Document 2: U.S. Pat. No. 5,290,395 Specification
Patent Document 3: U.S. Pat. No. 5,342,475 Specification
Patent Document 4: U.S. Pat. No. 4,404,172 Specification
Patent Document 5: U.S. Pat. No. 5,788,764 Specification
Patent Document 6: U.S. Pat. No. 6,673,330 Specification

DISCLOSURE OF THE INVENTION

An object of the present invention is to provide a method and an apparatus for producing crystals capable of keeping crystal quality and keeping a crystal composition uniform from an early phase to a late phase of crystal growth.

In order to accomplish such an object, in a method for producing crystals wherein the crystals are grown from a liquefying raw material in a crucible retained in a furnace and slowly cooling the raw material in the crucible from below upward, the present invention is characterized in that heating heaters are regulated to comprise a lower temperature area than a crystallization temperature in a lower portion of a crucible and a higher temperature area than the crystallization temperature in an upper portion thereof in a temperature distribution in a vertical direction in a furnace in which the crucible is retained, and a resupply raw material supplied from a raw material supply apparatus placed above the crucible is supplied by heating to the same temperature as in the higher temperature area.

In accordance with this method, since the resupply raw material corresponding to an amount of grown crystals is supplied at the same temperature as the temperature of the liquid raw material obtained by liquefying the raw material charged initially, it is possible to inhibit the variation in the crystal growth rate and grow the crystals with uniform crystal quality.

Since the resupply raw material is the liquid raw material decomposed at a significantly high temperature by making the temperature of the higher temperature area a soaking temperature, the raw material can be additionally supplied without causing deterioration of the crystal quality such as polycrystallization.

The apparatus for producing crystals according to the present invention is characterized by comprising a raw material supply apparatus which supplies a resupply raw material, and a reflection plate placed above a crucible, which liquefies the resupply raw material supplied from the raw material supply apparatus and dropping it as a liquid raw material into the crucible.

In accordance with this configuration, the resupply raw material for the crystal growth can be liquefied and dropped as the liquid raw material into the crucible by the reflection plate placed above the crucible.

BEST MODES FOR CARRYING OUT THE INVENTION

Embodiments of the present invention will be described in detail with reference to the drawings. As a matter of course, the present embodiments are exemplifications, and various changes and improvements can be given without departing from the scope of the invention.

EXAMPLE 1

Figure 1:
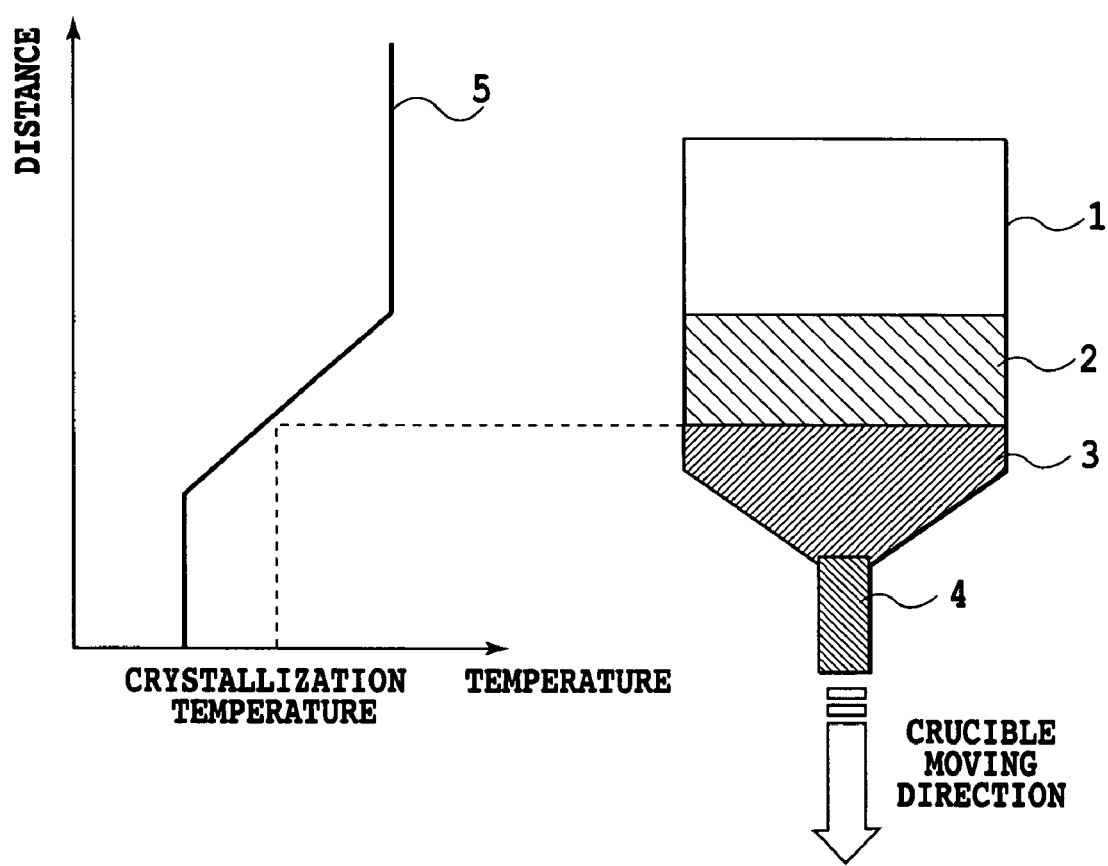
FIG. 1 is a view illustrating a method for producing crystals by a conventional Vertical Bridgman Method.
Figure 2:
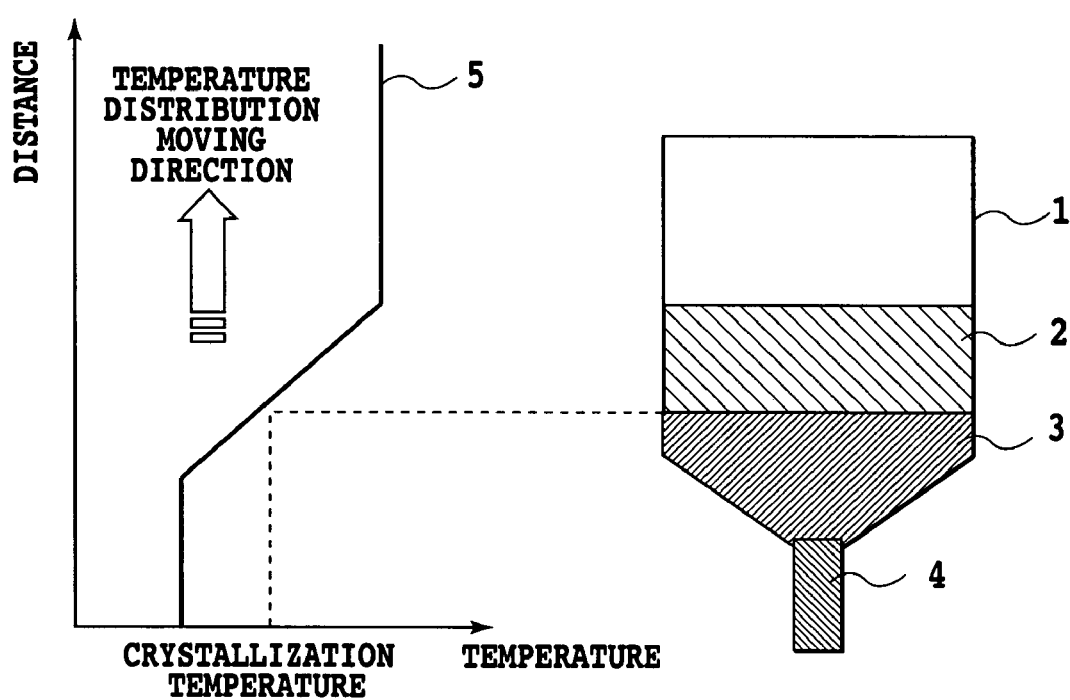
FIG. 2 is a view illustrating a method for producing crystals by a conventional vertical gradient freeze method.
Figure 3:
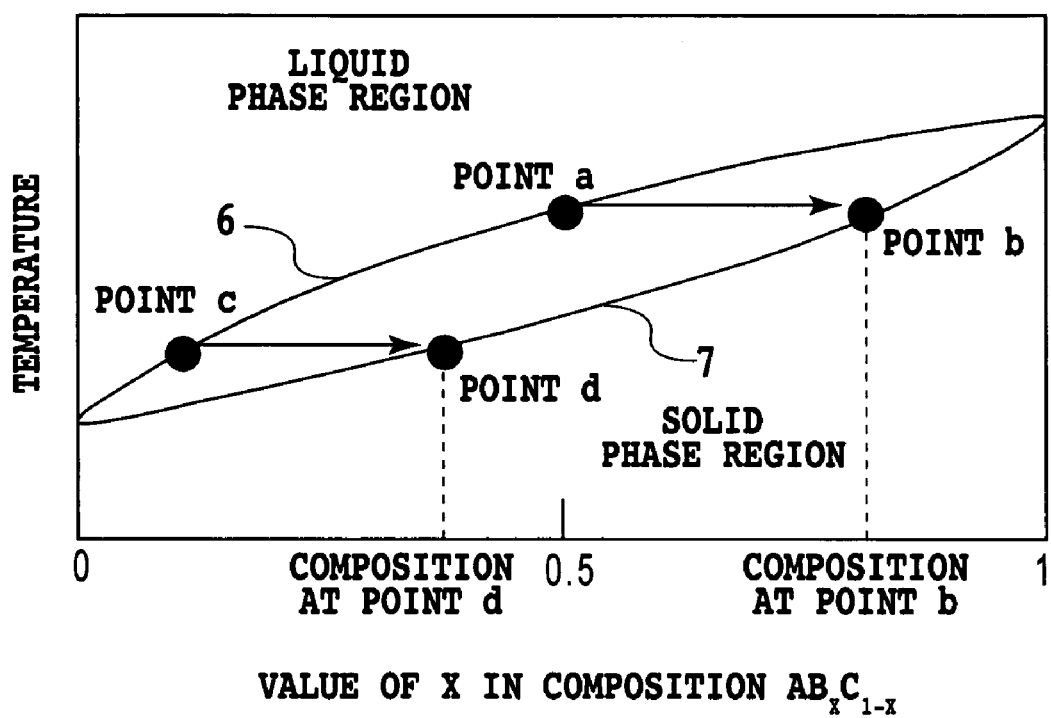
FIG. 3 is a phase diagram of a solid solution crystal composed of $AB_xC_{1-x}$.
Figure 4:
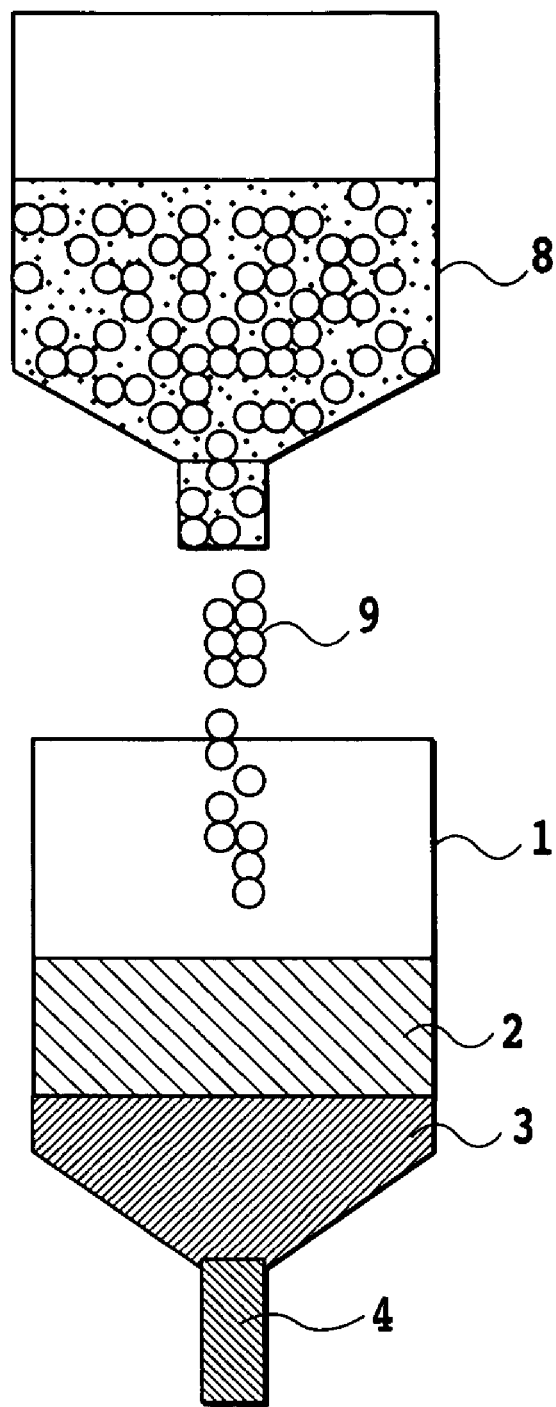
FIG. 4 is a view illustrating a method of additionally supplying a raw material during crystal growth to inhibit composition change.
Figure 5:
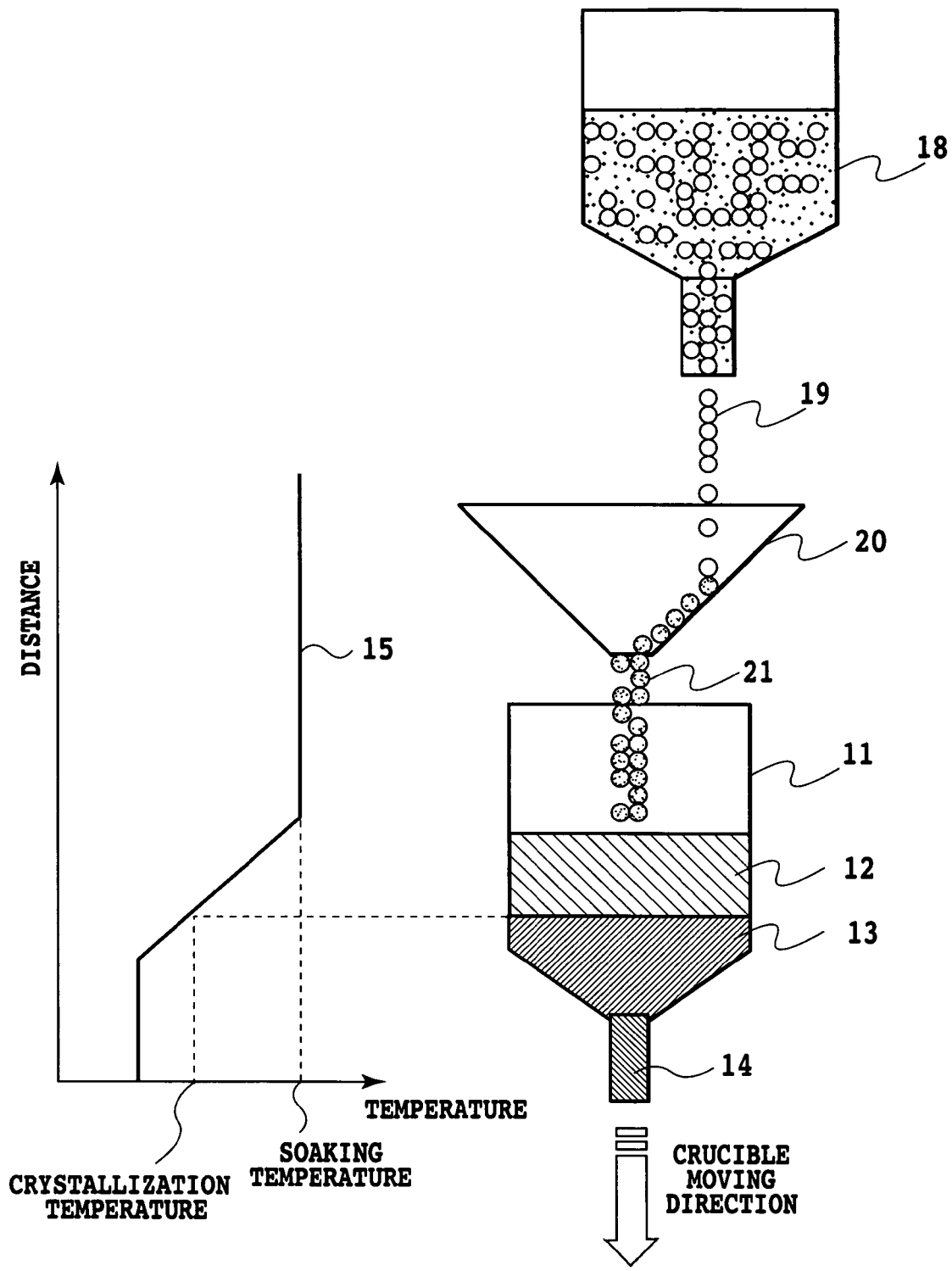
FIG. 5 is a view showing a configuration of an apparatus for producing crystals according to Example 1 of the present invention.

In FIG. 5, an apparatus for producing crystals according to Example 1 of the present invention is shown. The case of producing large type $KTa_xNb_{1-x}O_3$ ($0 \leq x \leq 1$) crystals will be shown. The apparatus for producing the crystals provides a funnel type reflection plate 20 in which a resupply raw material 19 supplied from a raw material supply apparatus 18 is liquefied, is given a soaking treatment and subsequently dropped as a liquid raw material 21 into a crucible 11, above the crucible 11.

First, a raw material at a ratio of K:Ta:Nb=50:25:25 is made from potassium carbonate, tantalum oxide and niobium oxide, and 500 g of the raw material is filled in a crucible 11 with a diameter of 2 inches, which is then retained in a furnace for producing crystals. The temperature is raised to make a temperature distribution 15 where the temperature in a crucible 11 upper portion is higher than the temperature in a crucible 11 lower portion in the furnace for producing the crystals to liquefy an initially charged raw material and give a soaking treatment thereto. Here, the temperature in the crucible 11 lower portion is lower than a crystallization temperature determined depending on a raw material composition, and the temperature in the crucible 11 upper portion is a higher temperature which is a soaking temperature than the crystallization temperature. As a matter of course, seeded crystals 14 are made not to be dissolved at that time. In Example 1, the crystallization temperature was 1180 degrees, the soaking temperature was 1280 degrees, which was retained for 10 hours.

Next, 500 g of a resupply raw material at a ratio of K:Ta:Nb=50:40:10 is filled in a raw material supply apparatus 18. Since the composition of the raw material initially filled is K:Ta:Nb=50:25:25, crystals of $KTa_{0.8}Nb_{0.2}O_3$ are grown in accordance with a phase diagram of $KTaO_3$-$KNbO_3$. Therefore, in order to supply the raw material in an amount equal to an amount consumed along with crystal growth, the composition of the resupply raw material 19 is K:Ta:Nb=50:40:10.

The crucible 11 is slowly pulled down at a rate of 2 mm/day and the resupply raw material 19 is dropped from the raw material supply apparatus 18 onto a heated funnel type reflection plate 20. The funnel type reflection plate 20 is made up of, for example, platinum. Since the funnel type reflection plate is heated with radiation heat from the crucible 11 and heat convection in the furnace, the resupply raw material 19 can be liquefied without requiring a heating mechanism for heating the funnel type reflection plate 20. In the funnel type reflection plate 20, a position in a vertical direction is controlled so that its surface temperature is the soaking temperature at 1280 degrees. Of course, the temperature of the liquid raw material 21 may be matched to the temperature in the crucible 11 upper portion described above by comprising the heating mechanism such as a heating heater in the funnel type reflection plate 20.

The position of the funnel type reflection plate 20 may be moved by working with the crucible 11, or may be moved independently from the crucible 11 in order to control the supply temperature of the liquid raw material 21, as long as the funnel type reflection plate 20 is placed above the crucible 11. It is desirable to sufficiently enlarge the surface area of the funnel type reflection plate 20 so as to be heated to the soaking temperature with the radiation heat from the crucible 11 and the heat convection in the furnace. It is also desirable to have sufficient heat capacity so that the temperature variation is reduced even when the resupply raw material 19 is dropped.

A supply amount of the raw material is matched with an amount consumed by the crystal growth. In the crucible with a diameter of 2 inches used, a crystal with a thickness of 2 mm at a constant diameter portion is 13g, and thus, a supply rate of the resupply raw material 19 is 13 g/day. This supply amount is converted into a rate per minute, and the resupply raw material 19 is supplied at a rate of 9 mg/minute. An alignment of the raw material supply apparatus 18 is shifted relatively to the funnel type reflection plate 20 so that the resupply raw material 19 is dropped on an inner surface of the funnel type reflection plate 20. By this, the resupply raw material 19 is liquefied while dropping on the inner surface of the funnel type reflection plate 20. An angle of an inclined plane of the funnel type reflection plate 20 was adjusted so that the liquefied raw material stays on the inclined plane for one hour. The resupply raw material 19 becomes the liquid raw material 21 to which the soaking treatment has been given while dropping on the inner surface of the funnel type reflection plate 20, and is stably supplied in the crucible 11 through the funnel type reflection plate 20.

This way, since the soaking treatment is given to the raw material in the amount corresponding to that of grown crystals and the liquid raw material 21 at the same temperature as that of the liquid raw material 12 obtained by liquefying the initially charged raw material is supplied, the temperature and the composition of the liquid raw material 12 can always be kept constant. Since the resupplied liquid raw material 21 is thoroughly decomposed by giving the soaking treatment, grown crystals 13 with high uniformity having no composition change can be stably grown.

As a Comparative Example, similar crystal production was performed without placing the funnel type reflection plate 20. The resupply raw material 19 was supplied in a solid state. Compared with the crystal produced in Example 1, compositional striations with a large variation range were observed in a grown area in the grown crystal. This is attributed to that the temperature of the liquid raw material 12 was lowered by adding the resupply raw material and the growth rate was changed by its temperature variation to increase the variation range.

Figure 6:
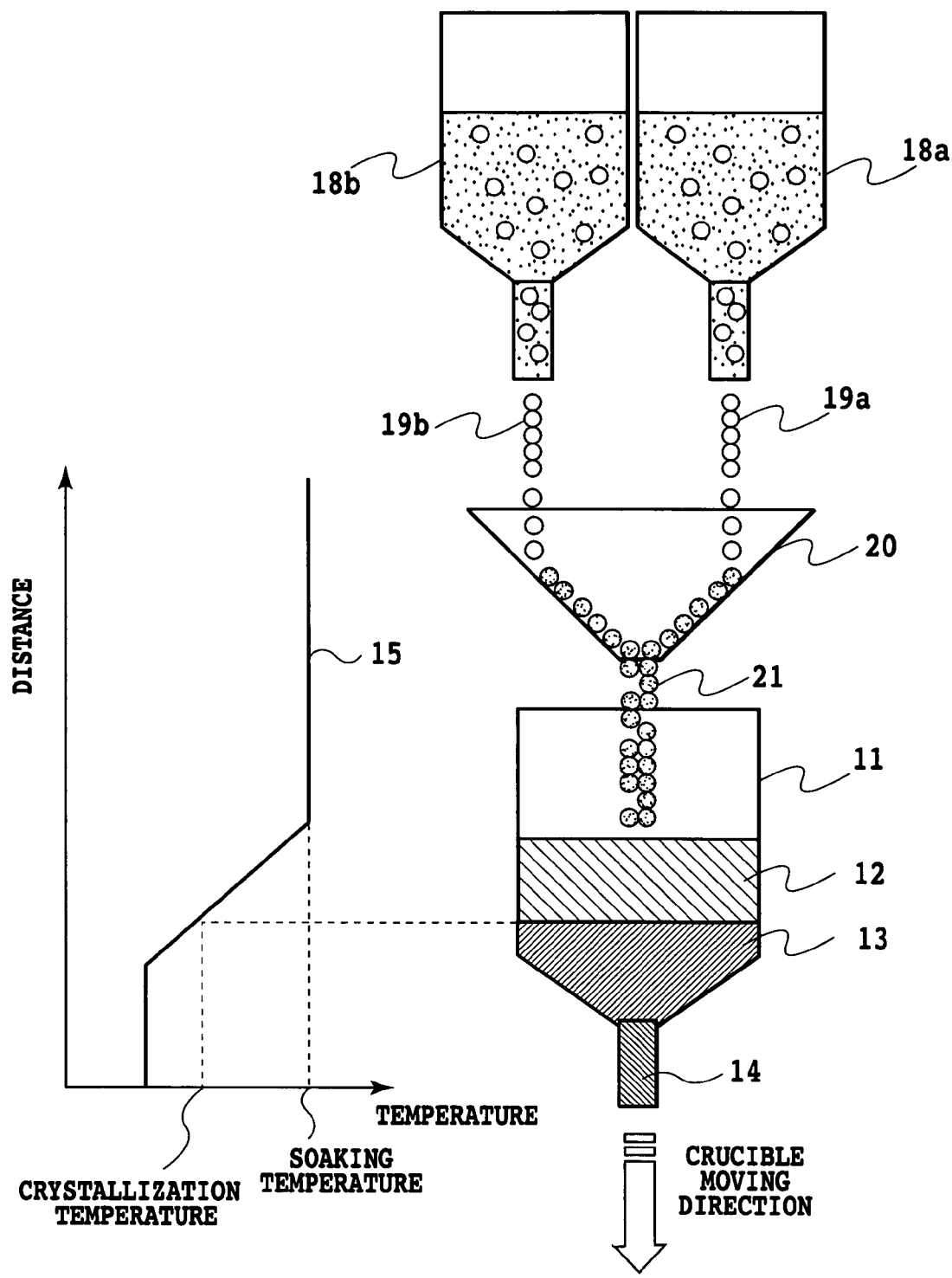
FIG. 6 is a view showing a configuration of an apparatus for producing crystals comprising multiple raw material supply apparatuses.

A configuration of an apparatus for producing crystals comprising multiple raw material supply apparatuses is shown in FIG. 6. In the above Example, the raw material supply apparatus 18 which supplies the resupply raw material 19 at a ratio of K:Ta:Nb=50:40:10 can be divided into multiple supply apparatuses. That is, a raw material supply apparatus 18a which supplies the resupply raw material 19a of K:Ta=50:50 and a raw material supply apparatus 18b which supplies the resupply raw material 19b of K:Nb=50:50 are placed above the funnel type reflection plate 20. Each raw material supply apparatus is controlled so that dropped amounts of respective resupply raw materials are 4:1 to liquefy the resupply raw materials 19a and 19b while slowly dropping on the surface of the funnel type reflection plate 20 and making the liquid raw materials 21 thoroughly decomposed at the soaking temperature.

EXAMPLE 2

Figure 7:
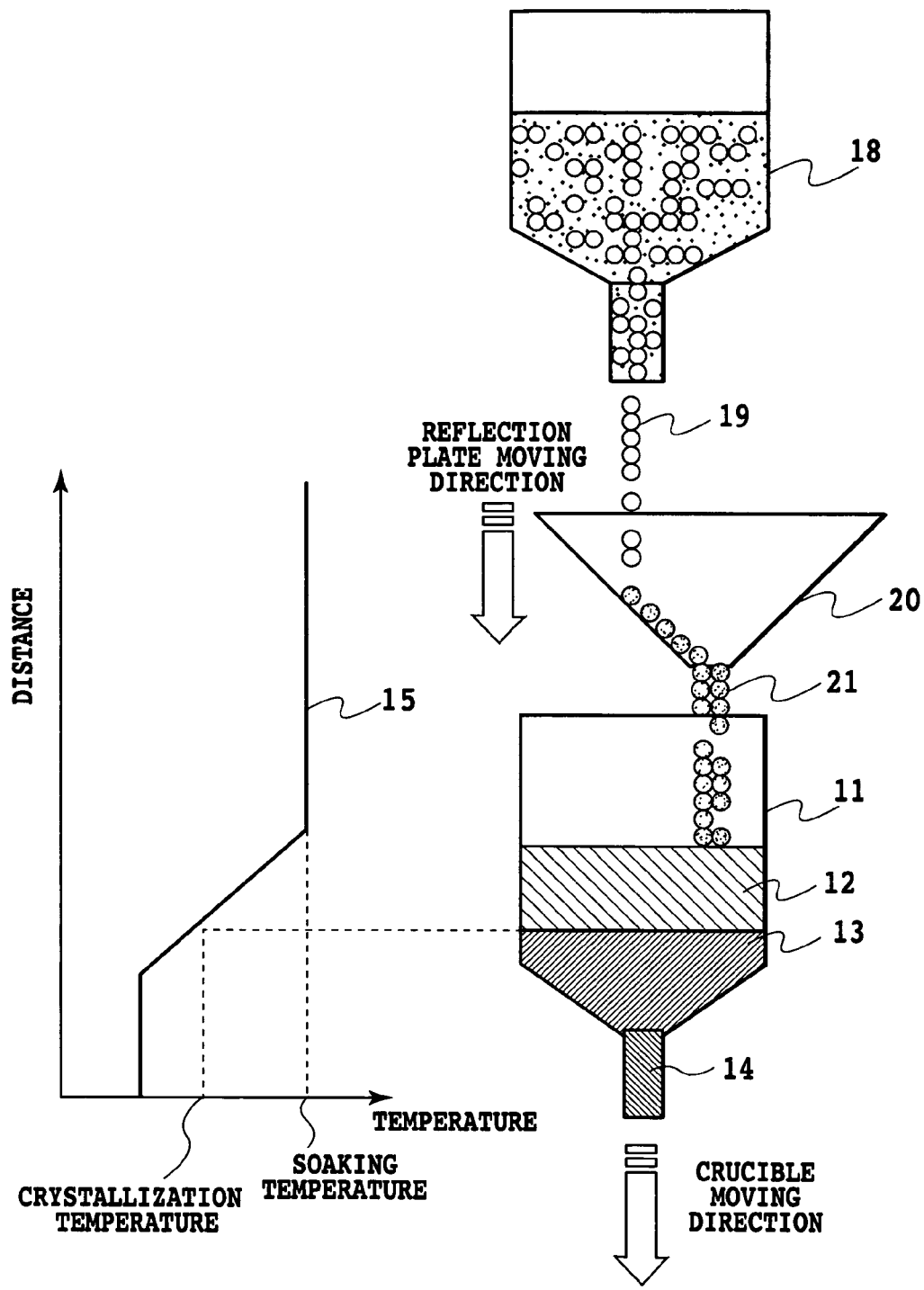
FIG. 7 is a view showing a configuration of an apparatus for producing crystals according to Example 2 of the present invention.

An apparatus for producing crystals according to Example 2 of the present invention is shown in FIG. 7. The case of producing long type $KTa_xNb_{1-x}O_3$ ($0 \leq x \leq 1$) crystals by the Vertical Bridgman Method will be shown. The apparatus for producing the crystals provides a funnel type reflection plate 20 in which a resupply raw material 19 supplied from a raw material supply apparatus 18 is liquefied, is given a soaking treatment and subsequently dropped as a liquid raw material 21 into a crucible 11, above the crucible 11.

First, a raw material at a ratio of K:Ta:Nb=50:25:25 was made from potassium carbonate, tantalum oxide and niobium oxide, and 500 g of the raw material is filled in the crucible 11 with a diameter of 2 inches, which is then retained in a furnace for producing crystals. The temperature is raised to make a temperature distribution 15 where the temperature in a crucible 11 upper portion is higher than the temperature in a crucible 11 lower portion in the furnace for producing the crystals to liquefy an initially charged raw material and give a soaking treatment thereto. Here, the temperature in the crucible 11 lower portion is lower than the crystallization temperature determined depending on a raw material composition, and the temperature in the crucible 11 upper portion is a higher temperature which is a soaking temperature than the crystallization temperature. It is a matter of course that seeded crystals 14 are made not to be dissolved at that time. In Example 2, the crystallization temperature was 1180 degrees, the soaking temperature was 1280 degrees, which was retained for 10 hours.

Next, 1000 g of a resupply raw material 19 at a ratio of K:Ta:Nb=50:40:10 is filled in the raw material supply apparatus 18. Since the composition of the raw material initially filled is K:Ta:Nb=50:25:25, crystals of $KTa_{0.8}Nb_{0.2}O_3$ are grown in accordance with a phase diagram of $KTa_3$-$KNbO_3$. Therefore, in order to supply the raw material in an amount equal to an amount consumed along with crystal growth, the composition of the resupply raw material 19 is K:Ta:Nb=50:40:10.

The crucible 11 is slowly pulled down at a rate of 1 mm/day and the resupply raw material 19 is dropped from the raw material supply apparatus 18 onto a heated funnel type reflection plate 20. The funnel type reflection plate 20 is made up of, for example, platinum. Since the funnel type reflection plate 20 is heated with radiation heat from the crucible 11 and heat convection in the furnace, the resupply raw material 19 can be liquefied without requiring a heating mechanism for heating the funnel type reflection plate 20. In the funnel type reflection plate 20, a position in a vertical direction is controlled so that its surface temperature is the soaking temperature at 1280 degrees.

A supply amount of the raw material is matched with an amount consumed by the crystal growth. In the crucible with a diameter of 2 inches used, the crystal with a thickness of 1 mm at a constant diameter portion is 7g, and thus, a supply rate of the resupply raw material 19 is 7 g/day. This supply amount is converted into a rate per minute, and the resupply raw material 19 is supplied at a rate of 5 mg/minute. An alignment of the raw material supply apparatus 18 is shifted relatively to the funnel type reflection plate 20 so that the resupply raw material 19 is dropped on an inner surface of the funnel type reflection plate 20. By this, the resupply raw material 19 is liquefied while dropping on the inner surface of the funnel type reflection plate 20. An angle of an inclined plane of the funnel type reflection plate 20 was adjusted so that the liquefied raw material stays on the inclined plane for one hour. The resupply raw material 19 becomes the liquid raw material 21 to which the soaking treatment has been given while dropping on the inner surface of the funnel type reflection plate 20, and is stably supplied in the crucible 11 through the funnel type reflection plate 20.

When the funnel type reflection plate 20 is fixed and the long type crystal is produced, a distance between the crucible 11 and the funnel type reflection plate 20 becomes long along with the crystal growth. Therefore, a dropping velocity of the liquid raw material 21 becomes fast due to gravity, and the liquid raw material 21 is dispersed in a milk crown state. Thus, the distance between the crucible 11 and the funnel type reflection plate 20 is kept constant by setting down the funnel type reflection plate 20 at the same speed as a setting down speed of the crucible 11. By keeping the distance constant, it is possible to inhibit dispersion of the solution composition 12.

This way, since the soaking treatment is given to the raw material in the amount corresponding to that of grown crystals and the liquid raw material 21 at the same temperature as that of the liquid raw material 12 obtained by liquefying the initially charged raw material is supplied, the temperature and the composition of the liquid raw material 12 can always be kept constant. Since the liquid raw material 21 is thoroughly decomposed by giving the soaking treatment, grown crystals 13 with high uniformity having no composition change can be stably grown.

EXAMPLE 3

Figure 8:
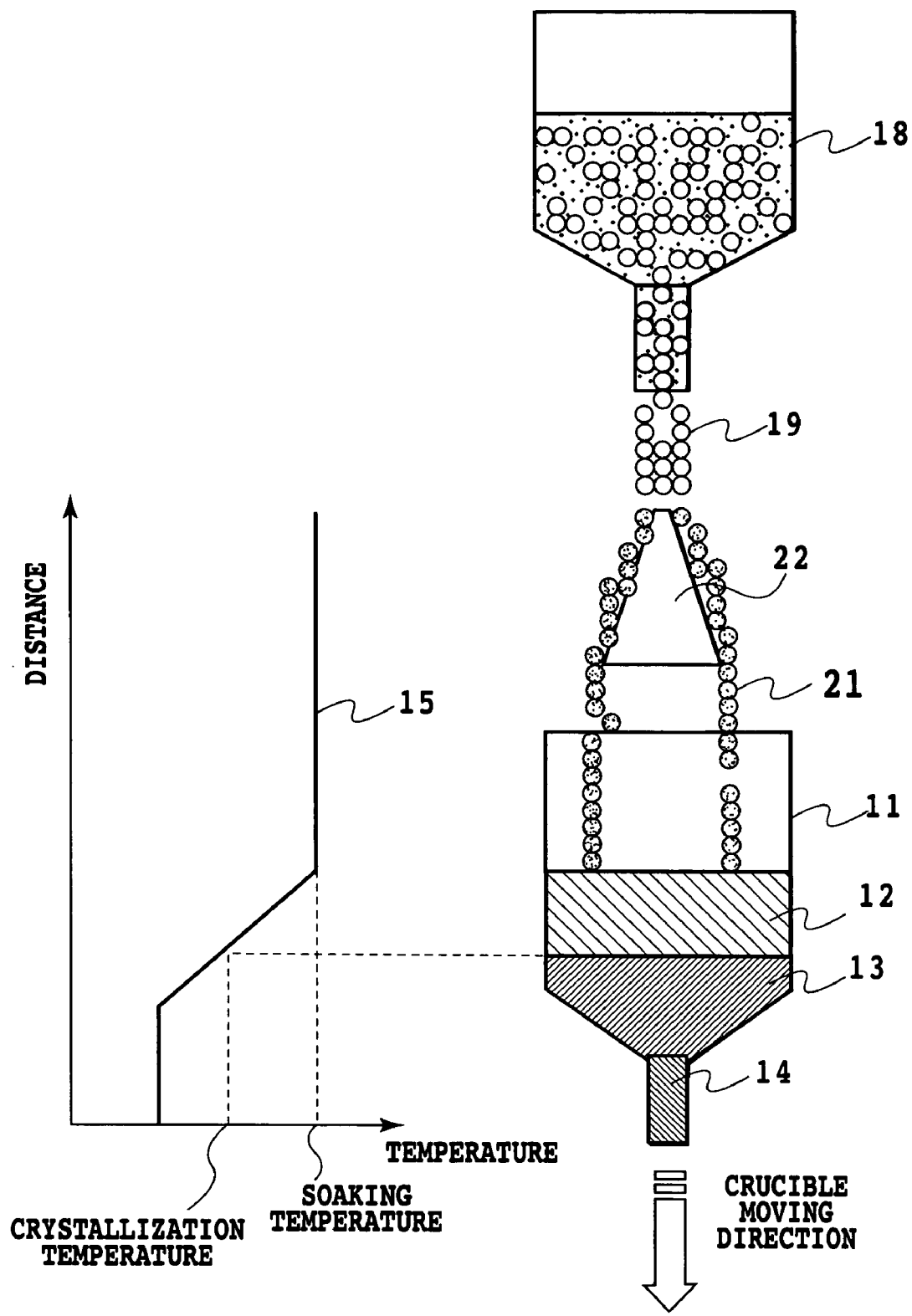
FIG. 8 is a view showing a configuration of an apparatus for producing crystals according to Example 3 of the present invention.

In FIG. 8, an apparatus for producing crystals according to Example 3 of the present invention is shown. The case of producing $KTa_xNb_{1-x}O_3$ ($0 \leq x \leq 1$) crystals by the Vertical Bridgman Method will be shown. The apparatus for producing the crystals provides a bugle type reflection plate 22 in which a resupply raw material 19 supplied from a raw material supply apparatus 18 is liquefied, is given a soaking treatment and subsequently dropped as a liquid raw material 21 into a crucible 11, above the crucible 11.

First, a raw material at a ratio of K:Ta:Nb=50:25:25 was made from potassium carbonate, tantalum oxide and niobium oxide, and 500 g of the raw material is charged in the crucible 11 with a diameter of 3 inches, which is then retained in a furnace for producing crystals. The temperature is increased to make a temperature distribution 15 where the temperature in a crucible 11 upper portion is higher than the temperature in a crucible 11 lower portion in the furnace for producing the crystals to liquefy an initially charged raw material and give a soaking treatment thereto. Here, the temperature in the crucible 11 lower portion is lower than the crystallization temperature determined depending on a raw material composition, and the temperature in the crucible 11 upper portion is a higher temperature, which is a soaking temperature than the crystallization temperature. It is a matter of course that seeded crystals 14 are made not to be dissolved at that time. In Example 3, the crystallization temperature was 1180 degrees, the soaking temperature was 1230 degrees, which was retained for 20 hours.

Next, 500 g of a resupply raw material 19 at a ratio of K:Ta:Nb=50:40:10 is filled in the raw material supply apparatus 18. Since the composition of the raw material initially filled is K:Ta:Nb=50:25:25, crystals of $KTa_{0.8}Nb_{0.2}O_3$ are grown in accordance with a phase diagram of $KTaO_3$-$KNbO_3$. Therefore, in order to supply the raw material in an amount equal to an amount consumed along with crystal growth, the composition of the resupply raw material 19 is K:Ta:Nb=50:40:10.

The crucible 11 is slowly pulled down at a rate of 2 mm/day and the resupply raw material 19 is dropped from the raw material supply apparatus 18 onto the heated bugle type reflection plate 22. The bugle type reflection plate 22 is made up of, for example, platinum. Since the bugle type reflection plate 22 is heated with radiation heat from the crucible 11 and heat convection in the furnace, the resupply raw material 19 can be liquefied without requiring a heating mechanism for heating the bugle type reflection plate 22. In the bugle type reflection plate 22, a position in a vertical direction is controlled so that its surface temperature is the soaking temperature at 1230 degrees. Of course, the temperature of the liquid raw material 21 may be matched to the temperature in the crucible 11 upper portion described above by comprising the heating mechanism such as a heating heater in the bugle type reflection plate 22.

The position of the bugle type reflection plate 22 may be moved by working with the crucible 11, or may be moved independently from the crucible 11 in order to control the supply temperature of the liquid raw material 21, as long as the reflection plate is placed above the crucible 11. It is desirable to sufficiently enlarge the surface area of the bugle type reflection plate 22 so as to be heated to the soaking temperature with the radiation heat from the crucible 11 and the heat convection in the furnace. It is also desirable to have sufficient heat capacity so that the temperature variation is reduced even when the resupply raw material 19 is dropped.

A supply amount of the raw material is matched with an amount consumed by the crystal growth. In the crucible with a diameter of 3 inches used, the crystal with a thickness of 2 mm at a constant diameter portion is 55 g, and thus, a supply rate of the resupply raw material 19 is 55 g/day. This supply amount is converted into a rate per minute, and the resupply raw material 19 is supplied at a rate of 38 mg/minute. An alignment of the raw material supply apparatus 18 may be directly above the bugle type reflection plate 22 as shown in the FIGURE, or may be shifted relatively to the bugle type reflection plate 22 so that the resupply raw material 19 is dropped on a inclined plane of the bugle type reflection plate 22. In the case of being directly above, it is suitable that a front portion of the bugle type reflection plate 22 is made into a cone shape. Accordingly, the resupply raw material 19 is liquefied while dropping on the inclined plane of the bugle type reflection plate 22. An angle of the inclined plane of the bugle type reflection plate 22 was adjusted so that the liquefied raw material stays on the inclined plane for one hour. The resupply raw material 19 becomes the liquid raw material 21 to which the soaking treatment has been given while dropping on the inclined plane of the bugle type reflection plate 22, and is stably supplied in the crucible 11 through the bugle type reflection plate 22.

As described above, since the soaking treatment is given to the raw material in the amount corresponding to that of grown crystals and the liquid raw material 21 at the same temperature as that of the liquid raw material 12 obtained by liquefying the initially charged raw material is supplied, the temperature and the composition of the liquid raw material 12 can always be kept constant. Since the resupplied liquid raw material 21 is thoroughly decomposed through the soaking treatment, grown crystals 13 with high uniformity having no composition change can be stably grown.

As the Comparative Example, similar crystal production was performed without placing the bugle type reflection plate 22. The resupply raw material 19 was supplied in a solid state. Compared with the crystal produced in Example 3, compositional striations with large variation range were observed in a grown area in the grown crystal. This is attributed to that the temperature of the liquid raw material 12 was lowered by adding the resupply raw material and the growth rate was changed by its temperature variation to increase the variation range.

(Reflection Plate)

Figure 9A:
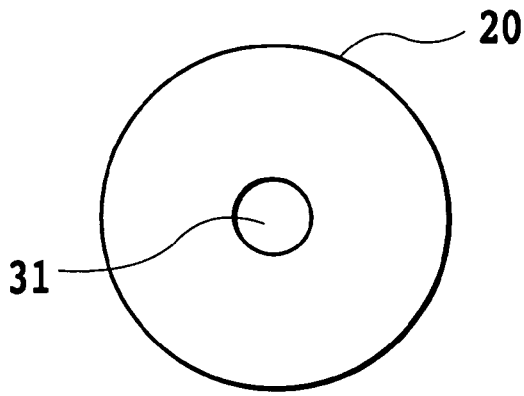
FIG. 9A is a top view showing a funnel type reflection plate according to one embodiment of the present invention.
Figure 9B:
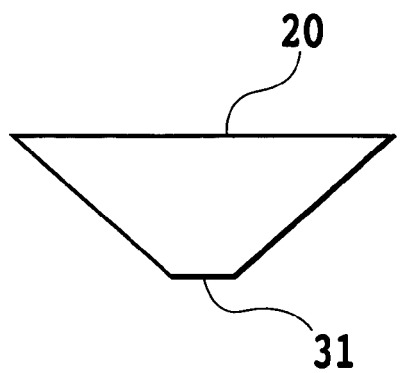
FIG. 9B is a side view showing a funnel type reflection plate according to one embodiment of the present invention.
Figure 9C:
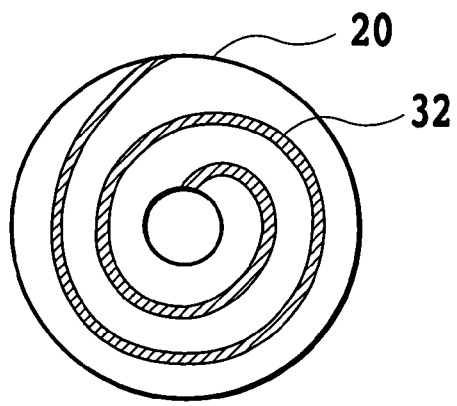
FIG. 9C is a top view showing another form of a funnel type reflection plate.
Figure 9D:
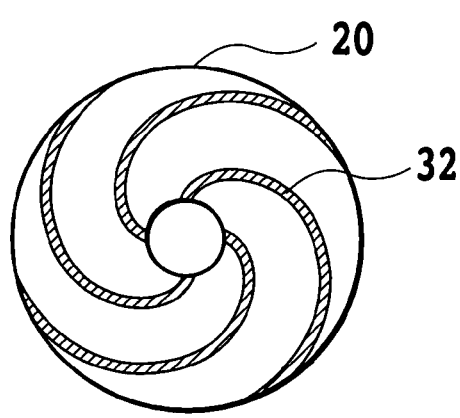
FIG. 9D is a top view showing another form of a funnel type reflection plate.
Figure 9E:
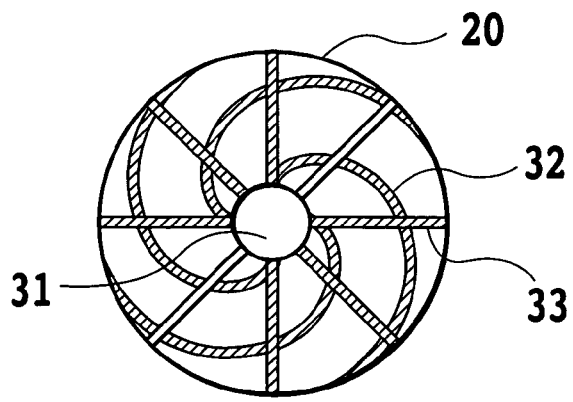
FIG. 9E is a top view showing another form of a funnel type reflection plate.

The funnel type reflection plates according to an embodiment of the present invention are shown in FIGS. 9A to 9E. They are the funnel type reflection plates 20 applicable to the apparatus for producing the crystals shown in FIG. 5 to FIG. 7. FIG. 9A shows a top view and FIG. 9B shows a side view. The funnel type reflection plate 20 has a funnel shape which narrows from above downward and a drop opening 31 which drops the liquid raw material 21 into the crucible 11 is provided at its bottom portion. Helical grooves 32 and radial grooves 33 may be formed inside the funnel as shown in FIGS. 9C to 9E.

In FIG. 9E, the resupply raw material 19 in a powder form dropped from the raw material supply apparatus 18 is liquefied on the funnel type reflection plate 20, runs through the grooves 32 and 33, and drops into the crucible 11 through the drop opening 31. A sectional shape of the grooves 32 and 33 is basically triangular, rectangular or semicircular, and the optimal shape is selected according to the viscosity of the liquefied resupply raw material 19. A staying time of the resupply raw material 19 after being liquefied on the funnel type reflection plate 20 can be adjusted by the shape of the grooves 32 and 33 and the angle of the inclined plane. In the present embodiment, the shape is a semicircle with a width of 5 mm and a depth of 3 mm. This can stably liquefy the resupply raw material 19 and supply it as the liquid raw material 21 into the crucible 11.

Figure 10A:
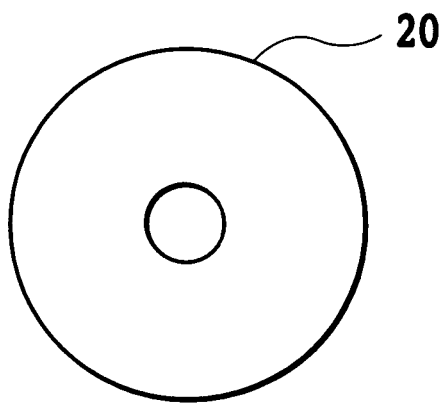
FIG. 10A is a top view showing a bugle type reflection plate according to one embodiment of the present invention.
Figure 10B:
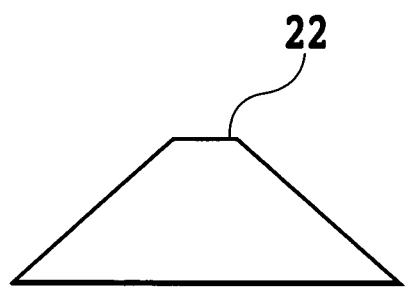
FIG. 10B is a side view showing a bugle type reflection plate according to one embodiment of the present invention.
Figure 10C:
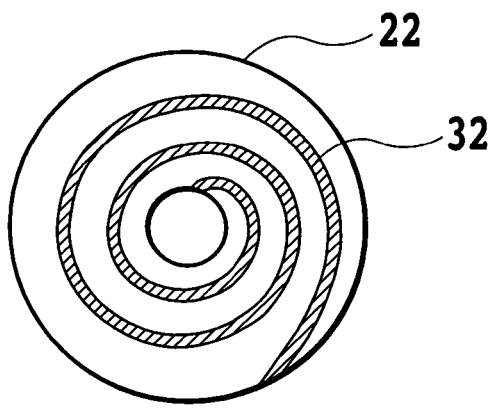
FIG. 10C is a top view showing another form of a bugle type reflection plate.
Figure 10D:
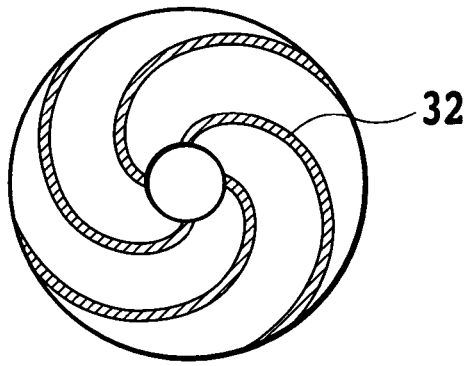
FIG. 10D is a top view showing another form of a bugle type reflection plate.
Figure 10E:
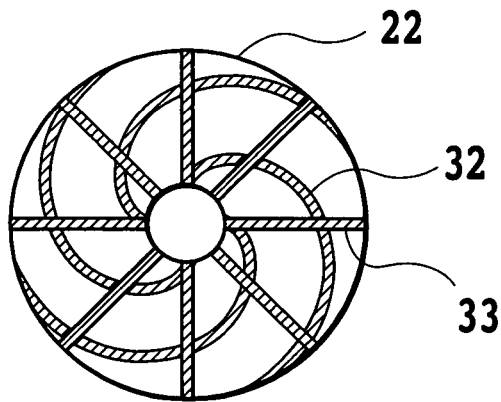
FIG. 10E is a top view showing another form of a bugle type reflection plate.

The bugle type reflection plates according to an embodiment of the present invention are shown in FIGS. 10A to 10E. They are the bugle type reflection plates 22 applicable to the apparatus for producing the crystals shown in FIG. 8. FIG. 10A shows a top view and FIG. 10B shows a side view. The bugle type reflection plate 22 is a bugle shape which expands downward. Helical grooves 32 and grooves 33 in a radial pattern from a center toward a periphery may be formed outside a bugle as shown in FIGS. 10C to 10E.

In FIG. 10E, the resupply raw material 19 in a powder form dropped from the raw material supply apparatus 18 can be liquefied on the bugle type reflection plate 22 and run through the grooves 32 and 33. A sectional shape of the grooves 32 and 33 is basically triangular, rectangular or semicircular, and the optimal shape is selected according to the viscosity of the liquefied resupply raw material 19. A staying time of the resupply raw material 19 after being liquefied on the bugle type reflection plate 22 can be adjusted by the shape of the grooves 32 and 33 and the angle of the inclined plane. In the present embodiment, the shape is a semicircle with a width of 5 mm and a depth of 3 mm. This can stably liquefy the resupply raw material 19 and supply it as the liquid raw material 21 to the crucible 11.

The present embodiments have been shown for the cases applied to the Vertical Bridgman Method, but it is obvious that they can also be applied to the vertical gradient freeze method, and no description is particularly required.

In the present embodiments, the methods for producing $KTa_xNb_{1-x}O_3$ crystals have been described, but they can be applied to the production of the crystals having other compositions. For example, major components of the crystal are composed of oxide or carbonate of Ia and Va groups in a periodic table, the Ia group comprises lithium and potassium, and the Va group can comprise at least one of niobium and tantalum. As added impurities, the Ia group, e.g., lithium or one or more of the IIa group in the periodic table can be contained. In the crystals made from the melt, such as B doped Si, P doped Si, In doped GaAs, Si doped GaAs and Fe doped InP crystals, to keep a dopant concentration constant, the same advantages as in the present embodiments can be obtained by implementing the melt in place of the solution, the overheating treatment in place of the soaking treatment, the overheating temperature in place of the soaking temperature and quartz glass or p-BN in place of the platinum.

The invention claimed is:

1. A method for producing crystals wherein the crystals are grown from a liquefying raw material in a crucible retained in a furnace and slowly cooling a solution of the raw material in the crucible from below upward, said method being characterized in that:
    heating heaters are controlled so as to have a lower temperature area than a crystallization temperature downward and a higher temperature area than the crystallization temperature above thereof in a temperature distribution in a vertical direction in the furnace in which the crucible is retained,
    a resupply raw material supplied from a raw material supply apparatus placed above the crucible is liquefied on a surface of a reflection plate placed above the crucible by heating at the same temperature as in the higher temperature area, held on the surface of the reflection plate for a certain time for a soaking treatment, and supplied into the crucible from the reflection plate, and
    the temperature in the higher temperature area is a soaking temperature which is 20 to 100° C. higher than the crystallization temperature.

2. The method for producing the crystals according to claim 1, wherein a major component of the crystal is composed of oxide or carbonate of Ia and Va groups in a periodic table, the Ia group is lithium or potassium and the Va group comprises at least one of niobium and tantalum.

3. The method for producing the crystals according to claim 1, wherein a major component of the crystal is composed of oxide or carbonate of Ia and Va groups in a periodic table, the Ia group is lithium or potassium, the Va group comprises at least one of niobium and tantalum, and one or more of Ia and IIa groups in the periodic table are contained as added impurities.

4. The method for producing crystals according to claim 1, wherein the certain time is 1 to 20 hours.

5. A method for producing crystals, wherein the crystals are grown from a liquefying raw material in a crucible retained in a furnace and slowly cooling a melt of the raw material in the crucible from below upward, said method being characterized in that:
    heating heaters are controlled so as to have a lower temperature area than a crystallization temperature downward and a higher temperature area than the crystallization temperature above thereof in a temperature distribution in a vertical direction in the furnace in which the crucible is retained,
    a resupply raw material supplied from a raw material supply apparatus placed above the crucible is liquefied on a surface of a reflection plate placed above the crucible by heating at the same temperature as in the higher temperature area, held on the surface of the reflection plate for a certain time for an overheating treatment, and supplied into the crucible from the reflection plate, and
    the temperature in the higher temperature area is an overheating treatment temperature which is 20 to 100° C. higher than the crystallization temperature.

6. The method for producing the crystals according to claim 5, wherein a major component of the crystal is composed of oxide or carbonate of Ia and Va groups in a periodic table, the Ia group is lithium or potassium and the Va group comprises at least one of niobium and tantalum.

7. The method for producing the crystals according to claim 5, wherein a major component of the crystal is composed of oxide or carbonate of Ia and Va groups in a periodic table, the Ia group is lithium or potassium, the Va group comprises at least one of niobium and tantalum, and one or more of Ia and IIa groups in the periodic table are contained as added impurities.

8. The method for producing crystals according to claim 5, wherein the certain time is 1 to 20 hours.

9. An apparatus for producing crystals wherein the crystals are grown from a liquefying raw material in a crucible retained in a furnace and slowly cooling the raw material in the crucible from below upward to produce the crystals, the apparatus comprising:
    a plurality of raw material supply apparatuses, each raw material supply apparatus being placed for each of multiple resupply raw materials having different compositions, wherein each supply amount of the resupply raw materials can be controlled; and
    a reflection plate placed above the crucible, which liquefies the resupply raw material supplied from the raw material supply apparatus and drops the liquefied resupply raw material as a liquid into the crucible.

10. An apparatus for producing crystals wherein the crystals are grown from a liquefying raw material in a crucible retained in a furnace and slowly cooling a solution of the raw material in the crucible from below upward, the apparatus comprising:
    a raw material supply apparatus which supplies a resupply raw material; and
    a reflection plate placed above the crucible, which liquefies the resupply raw material supplied from the raw material supply apparatus by heating the resupply raw material to the same temperature as a soaking temperature which is 20 to 100° C. higher than a crystallization temperature, holds the resupply raw material on the surface of the reflection plate for a certain time for a soaking treatment, and drops the resupply raw material as a liquid into the crucible, the reflection plate being physically separated from the raw material supply apparatus.

11. The apparatus for producing the crystals according to claim 10, wherein the reflection plate is in a flannel shape which narrows from above downward and is provided at its bottom portion with a drop opening which drops the liquid raw material into the crucible.

12. The apparatus for producing the crystals according to claim 11, wherein the reflection plate has a plurality of grooves extending from an upper portion thereof to the drop opening on an inner surface of the flannel shape so that the resupply raw material is held on the surface for the certain time.

13. The apparatus for producing the crystals according to claim 10, wherein the reflection plate is in a bugle shape which expands downward.

14. The apparatus for producing the crystals according to claim 13, wherein the reflection plate has a plurality of grooves extending from the center of the reflection plate to an extension on an outer surface of the bugle shape so that the resupply raw material is held on the surface for the certain time.

15. The apparatus for producing the crystals according to claim 10, wherein the reflection plate is configured so as to move independently from the crucible.

16. The apparatus for producing the crystals according to claim 10, wherein the reflection plate comprises a heating heater.

17. The apparatus for producing the crystals according to claim 10, wherein the raw material supply apparatuses are placed for each of multiple resupply raw materials having different compositions and each supply amount of the resupply raw materials can be controlled.

18. The apparatus for producing the crystals according to claim 10, wherein a major component of the crystal is composed of oxide or carbonate of Ia and Va groups in a periodic table, the Ia group comprises lithium or potassium and the Va group comprises at least one of niobium and tantalum.

19. The apparatus for producing the crystals according to claim 10, wherein a major component of the crystal is composed of oxide or carbonate of Ia and Va groups in a periodic table, the Ia group comprises lithium or potassium, the Va group comprises at least one of niobium and tantalum, and one or more of Ia and IIa groups in the periodic table are contained as added impurities.

20. The apparatus for producing crystals according to claim 10, wherein the certain time is 1 to 20 hours.

21. An apparatus for producing crystals wherein the crystals are grown from a liquefying raw material in a crucible retained in a furnace and slowly cooling a melt of the raw material in the crucible from below upward to produce the crystals, the apparatus comprising:
a raw material supply apparatus which supplies a resupply raw material; and
a reflection plate placed above the crucible, which liquefies the resupply raw material supplied from the raw material supply apparatus by heating the resupply raw material to the same temperature as an overheating treatment temperature which is 20 to 100° C. higher than a crystallization temperature, holds the resupply raw material on the surface of the reflection plate for a certain time for an overheating treatment, and drops the resupply raw material as a liquid into the crucible.

22. The apparatus for producing the crystals according to claim 21, wherein the reflection plate is in a funnel shape which narrows from above downward and is provided at its bottom portion with a drop opening which drops the liquid raw material into the crucible.

23. The apparatus for producing the crystals according to claim 22, wherein the reflection plate has a plurality of grooves extending from an upper portion thereof to the drop opening on an inner surface of the funnel shape so that the resupply raw material is held on the surface for the certain time.

24. The apparatus for producing the crystals according to claim 21, wherein the reflection plate is in a bugle shape which expands downward.

25. The apparatus for producing the crystals according to claim 24, wherein the reflection plate has a plurality of grooves extending from the center of the reflection plate to an extension on an outer surface of the bugle shape so that the resupply raw material is held on the surface for the certain time.

26. The apparatus for producing the crystals according to claim 21, wherein the reflection plate is configured so as to move independently from the crucible.

27. The apparatus for producing the crystals according to claim 21, wherein the reflection plate comprises a heating heater.

28. The apparatus for producing the crystals according to claim 21, wherein the raw material supply apparatuses are placed for each of multiple resupply raw materials having different compositions and each supply amount of the resupply raw materials can be controlled.

29. The apparatus for producing the crystals according to claim 21, wherein a major component of the crystal is composed of oxide or carbonate of Ia and Va groups in a periodic table, the Ia group comprises lithium or potassium and the Va group comprises at least one of niobium and tantalum.

30. The apparatus for producing the crystals according to claim 21, wherein a major component of the crystal is composed of oxide or carbonate of Ia and Va groups in a periodic table, the Ia group comprises lithium or potassium, the Va group comprises at least one of niobium and tantalum, and one or more of Ia and IIa groups in the periodic table are contained as added impurities.

31. The apparatus for producing crystals according to claim 21, wherein the certain time is 1 to 20 hours.

* * * * *